United States Patent
Fürst et al.

(10) Patent No.: US 8,975,112 B2
(45) Date of Patent: Mar. 10, 2015

(54) DEVICE FOR SPRAYING, METHOD THEREFOR, AND ORGANIC ELECTRONIC CONSTRUCTION ELEMENT

(71) Applicant: Siemens Aktiengesellschaft, Munich (DE)

(72) Inventors: Jens Fürst, Herzogenaurach (DE); Oliver Hayden, Herzogenaurach (DE); Johannes Kern, Herzogenaurach (DE); Tobias Rauch, Fürstenfeldbruck (DE); Tobias Sterzl, Nürnberg (DE); Sandro Francesco Tedde, Erlangen (DE); Edgar Zaus, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 14/032,717

(22) Filed: Sep. 20, 2013

(65) Prior Publication Data
US 2014/0021454 A1    Jan. 23, 2014

Related U.S. Application Data

(63) Continuation of application No. 12/933,280, filed on Sep. 17, 2010, now abandoned, and a continuation of application No. PCT/EP2009/053147, filed on Mar. 17, 2009.

(30) Foreign Application Priority Data

Mar. 20, 2008 (DE) .......... 10 2008 015 290
Aug. 22, 2008 (DE) .......... 10 2008 039 337

(51) Int. Cl.
H01L 51/40    (2006.01)
H01L 51/00    (2006.01)
(Continued)

(52) U.S. Cl.
CPC ........ *H01L 51/0003* (2013.01); *H01L 51/0004* (2013.01); *H01L 51/0047* (2013.01);
(Continued)

(58) Field of Classification Search
CPC ........................... H01G 9/2027; H01G 9/0029
USPC ............................................... 257/40; 438/99
IPC ......................................... H01G 9/0029, 9/2027
See application file for complete search history.

(56) References Cited

U.S. PATENT DOCUMENTS 3,570,725 A    3/1971    Baker et al.
3,584,571 A    6/1971    Schmoll et al.
(Continued)

FOREIGN PATENT DOCUMENTS

DE    562872    10/1932
DE    1204981    11/1965
(Continued)

OTHER PUBLICATIONS

Doojin Vak et al., "Fabrication of organic bulk heterojunction solar cells by a spray deposition method for low-cost power generation", Applied Physics Letters, vol. 91, Issue 8, 081102, 2007, 3 pp.
(Continued)

*Primary Examiner* — Caleb Henry
(74) *Attorney, Agent, or Firm* — Staas & Halsey LLP

(57) ABSTRACT

The embodiments relate to a device and a method for spraying coatings of organic construction elements. The embodiments relate, in particular, to the spraying of coatings made up of components that do not dissolve in the same solvent, for example, and/or the spraying of a plurality of coatings one after the other. A plurality of spray heads is used, for example one after the other and/or next to one another.

6 Claims, 6 Drawing Sheets

(51) Int. Cl.
*H01L 51/42* (2006.01)
*B05D 1/02* (2006.01)
*B05D 1/34* (2006.01)

(52) U.S. Cl.
CPC .............. *H01L51/4253* (2013.01); *B05D 1/02* (2013.01); *B05D 1/34* (2013.01); *H01L 51/0036* (2013.01); *Y02E 10/549* (2013.01)
USPC .............................................. 438/99; 257/40

(56) References Cited

U.S. PATENT DOCUMENTS

| | | | |
|---|---|---|---|
| 4,341,821 | A | 7/1982 | Toda et al. |
| 6,630,566 | B1 | 10/2003 | Allen et al. |
| 7,141,449 | B2 | 11/2006 | Shiozaki |
| 7,264,753 | B2 | 9/2007 | Zhang |
| 8,057,850 | B2 | 11/2011 | Curtis et al. |
| 2003/0049369 | A1 | 3/2003 | Tanaka et al. |
| 2004/0054095 | A1 | 3/2004 | Allen et al. |
| 2004/0149834 | A1 | 8/2004 | Shimoda et al. |
| 2004/0159793 | A1* | 8/2004 | Brabec et al. ............ 250/370.11 |
| 2005/0161076 | A1 | 7/2005 | Shiozaki |
| 2006/0033978 | A1* | 2/2006 | Morin et al. .................. 359/265 |
| 2006/0068083 | A1 | 3/2006 | Moon et al. |
| 2006/0152833 | A1 | 7/2006 | Halls et al. |
| 2006/0234505 | A1 | 10/2006 | Asano et al. |
| 2006/0237695 | A1 | 10/2006 | Williams et al. |
| 2007/0107776 | A1 | 5/2007 | Li et al. |
| 2007/0207565 | A1* | 9/2007 | Kodas et al. ..................... 438/61 |
| 2007/0251570 | A1* | 11/2007 | Eckert et al. .................. 136/256 |
| 2008/0041436 | A1* | 2/2008 | Lau et al. ...................... 136/244 |
| 2008/0196761 | A1 | 8/2008 | Nakano et al. ................ 136/258 |
| 2008/0260625 | A1* | 10/2008 | Kogoi et al. ................... 423/610 |
| 2008/0315187 | A1* | 12/2008 | Bazan et al. ..................... 257/40 |
| 2009/0050878 | A1* | 2/2009 | Okada et al. ..................... 257/40 |
| 2009/0203194 | A1* | 8/2009 | Tanaka .......................... 438/478 |
| 2010/0043873 | A1 | 2/2010 | Kim et al. |
| 2010/0207114 | A1* | 8/2010 | Koenemann et al. ........... 257/40 |
| 2011/0024734 | A1* | 2/2011 | Furst et al. ....................... 257/40 |

FOREIGN PATENT DOCUMENTS

| | | |
|---|---|---|
| DE | 1948401 | 6/1970 |
| DE | 102008029782 A1 | 3/2012 |
| WO | 03/107453 A2 | 12/2003 |
| WO | 2004/063277 A1 | 7/2004 |

OTHER PUBLICATIONS

Christoph J. Brabec et al., "Plastic Solar Cells", Advanced Functional Materials, vol. 11, No. 1, 2001, pp. 15-26.

Office Action mailed Jun. 20, 2013 in corresponding U.S. Appl. No. 12/933,280.

U.S. Appl. No. 12/933,280, filed Sep. 17, 2010, Dr. Jens Fürst et al., Siemens Aktiengesellschaft.

European Search Report mailed Feb. 26, 2014 in corresponding European Application No. 12008289.6-1555.

Ishikawa Takamasa et al; "Preparation of organic bulk heterojunction photovoltaic cells by evaporative spray deposition from ultradilute solution"; Applied Physics Letters, American Institute of Physics; Bd. 84; Nr. 13; pp. 2424-2426; ISSN: 0003-6951; DOI: 10.1063/1.1690493; XP012060953; Mar. 29, 2004.

Ishikawa T. et al; "Photovoltaic cells of fullerene / polyphenylenevinylene derivative prepared by spray deposition"; Proceedings of SPIE, International Society for Optical Engineering; Bd. 5215; Nr. 1; pp. 211-218; ISSN: 0277-786X; DOI: 10.1117/12.505671; XP001193709; Aug. 8, 2003.

Schilinsky Pavel et al; "Performance Analysis of Printed Bulk Heterojunction Solar Cells"; Advanced Functional Materials, Wiley—VCH Verlag GmbH&CO KGAA; Bd. 16; Nr. 13; pp. 1669-1672; ISSN: 1616-301X; DOI: 10.1002/ADFM.200500581; XP001244988; Sep. 5, 2006.

* cited by examiner

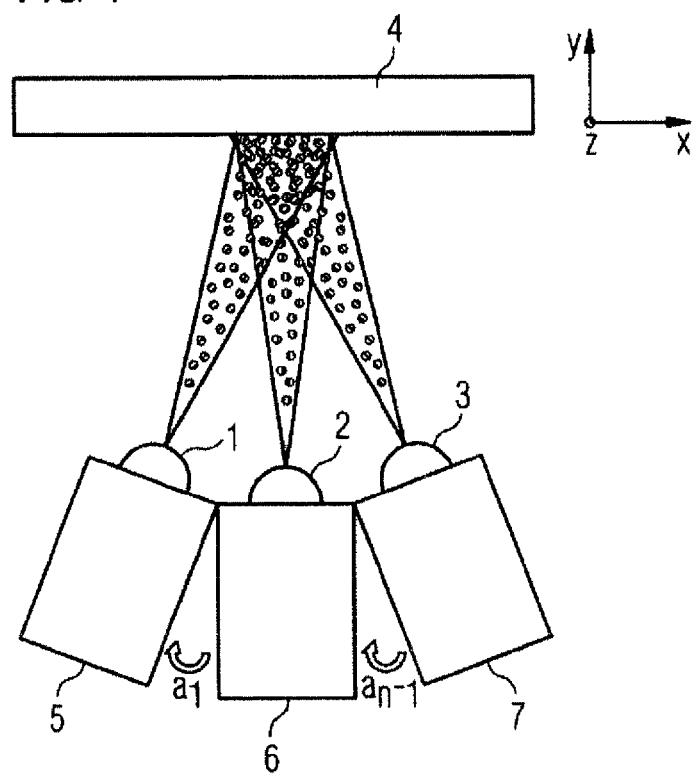

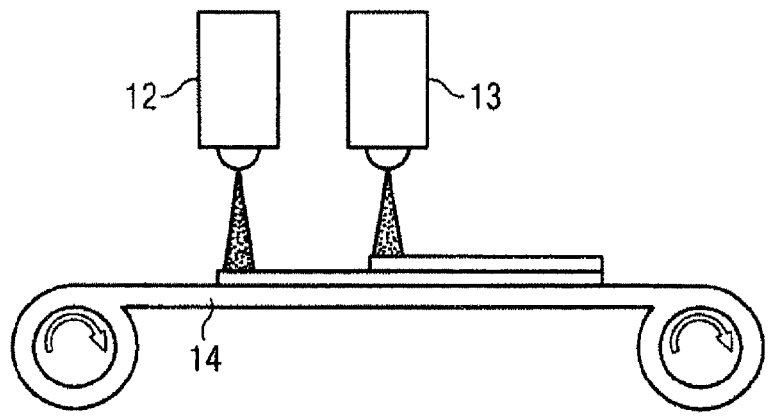
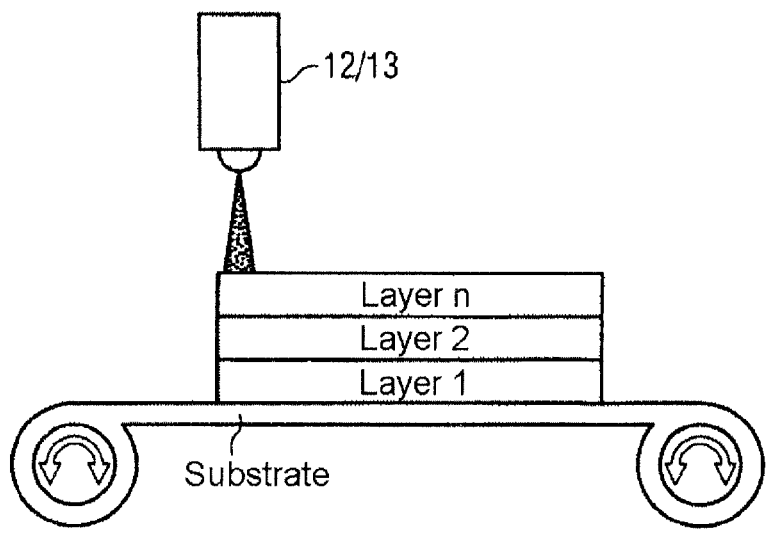

DEVICE FOR SPRAYING, METHOD THEREFOR, AND ORGANIC ELECTRONIC CONSTRUCTION ELEMENT

CROSS REFERENCE TO RELATED APPLICATIONS

This application is a continuation of U.S. patent application Ser. No. 12/933,280, filed Sep. 17, 2010, which is the U.S. national stage of International Application No. PCT/EP2009/053147, filed Mar. 17, 2009 and claims the benefit thereof. The International Application claims the benefits of German Application No. 10 2008 015 290.0 filed on Mar. 20, 2008 and German Application No. 10-2008 039 337.1, filed Aug. 22, 2008, all applications are incorporated by reference herein in their entirety.

BACKGROUND

1. Field

The embodiments relate to an apparatus and a method for spraying layers of organic devices. In particular, the embodiments to spraying layers having multiple components, which for example are not soluble in the same solvent.

2. Description of the Related Art

Spray coating serves as a low-cost polymer coating method for producing electronic devices, such as solar cells or photodiodes on an organic basis, as known, for example, from WO 2003/107453 and the publication by Doojin Vak, Seok-Soon Kim, Jang Jo, Seung-Hwan Oh, Seok-In Na, Juhwan Kim, and Dong-Yu Kima "Fabrication of organic bulk heterojunction solar cells by a spray deposition method for low-cost power generation", APPLIED PHYSICS LETTERS 91, 081102 (2007). In particular in the area of solar cells and photodetectors, efficiencies are drastically increased by the combination of a donor material (absorber and hole transport component) and an acceptor material (electron acceptor and transport component) in the photo-active layer of the device. This active layer comprises a mixture (blend) of these two substances and is better known as a "bulk heterojunction". The separation of the charge carriers takes place at the interfaces of the two materials that form within the overall volume of the layer. A precondition for such a blend is that the two materials are soluble in the same solvent. Consequently, the bulk heterojunction solution can be applied to the substrate by low-cost methods such as spin coating, blade coating, slit coating, dip coating, inkjet printing, doctor blading and gravure printing, etc.

However, there are materials that have promising electronic properties but are not soluble in the same solvent. It is consequently impossible to produce a bulk heterojunction solution from these materials. Normally, in this case two-layer systems (bilayers) are produced, which however must forgo the positive properties, such as higher efficiencies, of a bulk heterojunction.

A further problem that frequently occurs is the production of multiply stacked polymer layers (multilayers) which are soluble in the same solvent. In this case (for example tandem OLEDs, tandem OPDs or tandem solar cells), unfortunately, the aforementioned coating methods cannot be used, since the application of a layer re-dissolves the layer lying thereunder, since the material forming the following layer is applied in the same solvent.

A further disadvantage of the previously known methods is that, depending on the solvent and application method used, with these application methods the maximum layer thickness that can be produced is limited.

SUMMARY

An aspect of the embodiments is therefore to overcome the disadvantages of the prior art and provide an apparatus and a method with which it is possible at low cost to spray multiple components in different or the same solvents simultaneously onto a substrate, thicker layers and/or multiple layers.

The subject matter of the embodiments, and the solution achieving the aspects, is therefore an apparatus for spraying a sheet-like substrate, including an atomizer, a reservoir and a holder, the apparatus having at least two reservoirs and/or the atomizer having at least two spray heads and/or the apparatus being designed for multiple spraying of the same surface area. Similarly, the subject matter is a method for spraying a sheet-like substrate in which at least two spray heads spray different or the same spraying agents onto one or the same surface area or one spray head repeatedly sprays the same surface area. Finally, the subject matter is an organic electronic device, including a substrate, a lower electrode and an organic active layer with an upper electrode arranged above it, the photo-conductive organic layer being obtainable in the form of a bulk heterojunction by an apparatus or a method as described herein.

For example, an apparatus is designed for multiple spraying of the same surface area if the reservoir is disproportionately large in comparison with the surface area to be sprayed, in which case it is advantageous if the reservoir is fixed and the spray heads are supplied with agent through a supply line, which may also be flexible. Furthermore, an apparatus is designed for multiple spraying of the same surface area if the holder is connected to a mechanism by which the spray head is automatically moved repeatedly back and forth, or if, in a roll-to-roll spray method, the rolls are designed such that a surface area can be drawn back and forth repeatedly under the apparatus for spraying. The rolls of the system are then designed such that they can make the continuous strip that is to be sprayed rotate in both directions. Thus, the substrate is made to pass under the spraying spray head a number of times. This makes it possible for any desired layer thicknesses of the functional polymers of the device to be applied in one coating process step.

In the present case, an atomizer refers to a part of a spraying apparatus in which the spraying agent is atomized by supplying gas, and in particular ambient air, with or without a compressor. A conventional atomizer has only one, firmly fixed spray head, it being proposed according to the invention that multiple spray heads, which are fed from different or the same reservoir(s), form the atomizer. The geometrical system of the spray heads in the atomizer may be as desired, for example the spray heads may be arranged in the atomizer in a circular or semicircular form. Particularly preferred is the embodiment in which the spray heads can be switched on and off as desired and/or the spray heads can be fixed in various positions.

According to an advantageous embodiment, the spray heads are movably arranged in the atomizer, so that the alignment and/or the position of the spray heads with respect to the surface area to be sprayed is variable.

According to an advantageous embodiment, the same spraying agents are applied by different spray heads, so that thick layers are obtained. The application of the functional polymers with the aid of this "multiple" spraying method allows the production of layers of any desired thickness and can be integrated in high-throughput fabrication processes, such as roll-to-roll methods.

Consequently, various organic electronic devices, as are the subject matter of the invention, can be produced, for example fully spray-coated solar cells, organic field-effect transistors, organic capacitors, organic electrochromic devices, organic light-emitting diodes or organic photodiodes.

The layer thickness of the hole conductor and the semiconducting absorber material can be variably changed by spray coating. Thicker layers mean a higher absorption of the incident radiation, which converts into higher efficiencies and, in the case of organic photodiodes, lower dark currents.

According to a further advantageous embodiment, different spraying agents are fed into the individual spray heads of the apparatus, so that the formation of a layer of multiple components, for example in different solvents, is made possible.

According to an advantageous embodiment of the apparatus, the spray heads are arranged in a semicircular form. In this case, the ideal spray line is perpendicular to the substrate to be sprayed, so that the spray heads are arranged as closely as possible around this line.

According to a an embodiment of the method, the spray heads are fixed and the substrate to be sprayed is moved under the spray heads.

The use of organic electronics is continuously increasing because of the low-cost production methods and the increasing efficiencies of solar cells, LEDs, FETs and photodetectors. In the area of solar cells and photodetectors, a high efficiency is achieved by a blend of different organic materials, known as a composite, including an electron donor (absorber and hole transport components; usually a semiconducting polymer) and an electron acceptor (electron transport component; usually a fullerene)—also known as a "bulk heterojunction" (BHJ). The separation of the charge carriers takes place at the interfaces of the two materials that form within the volume of the layer as a whole. All composites that can be applied by wet-chemical processes are attractive for the low-cost production of the aforementioned electrical devices.

The semiconductor solutions may be applied by methods such as spin coating, blade coating, slit coating, dip coating and spray coating.

Thanks to the flexibility of the organic semiconductors, devices can also be realized on flexible substrates (e.g. PET, PES and PEN) for large-area applications such as in the case of organic solar cells.

In all the aforementioned devices, a hole conductor, such as poly(3,4-ethylenedioxythiophene) poly(styrenesulfonate) (PEDOT:PSS for short), is used as an intermediate layer (between the anode and the "bulk heterojunction"). PEDOT:PSS is usually applied to the bottom electrode (anode), in order to smooth the surface and optimize the injection or extraction of charge carriers (depending on whether it is a light-emitting diode or a solar cell or a photodiode). Moreover, this hole transport layer or electron blocking layer is used as a "buffer" layer to avoid short-circuits caused by possible "spikes" in the bottom electrode.

So far, the PEDOT:PSS layer has usually been applied by spin coating or doctor blading methods and with layer thicknesses in the range of 80-120 nm. The reason for this is to maintain a low surface roughness of the electrode in order to avoid possible short-circuits. However, spin coating and doctor blading entail the disadvantage that only thin layers of the intermediate layer can be applied. The photo-active BHJ layer has also only been applied so far by the aforementioned methods. In the case of the BHJ, the production of a thicker layer is even more important, since a higher absorption of the incident radiation is ensured. In the case of an organic photodiode, a thicker BHJ layer is particularly valuable and also reduces the dark current.

Thicker layers (>100 µm) are also advantageous for x-ray detection, as already known from the still unpublished DE 10 2008 029 782.8.

BRIEF DESCRIPTION OF THE DRAWINGS

These and other aspects and advantages will become more apparent and more readily appreciated from the following description of the exemplary embodiments, taken in conjunction with the accompanying drawings of which:

FIG. 1 shows an embodiment of a spraying apparatus according to the invention, in which a bulk heterojunction is realized, FIG. 2a shows a further embodiment of the spraying apparatus, it being possible for example to realize a hole conductor layer of PEDOT:PSS or a thick layer by multiple spraying with the same spraying agent, FIG. 2b shows the principle of multiple spray coating with a spray gun.

DETAILED DESCRIPTION OF THE PREFERRED EMBODIMENT

Figure 3:
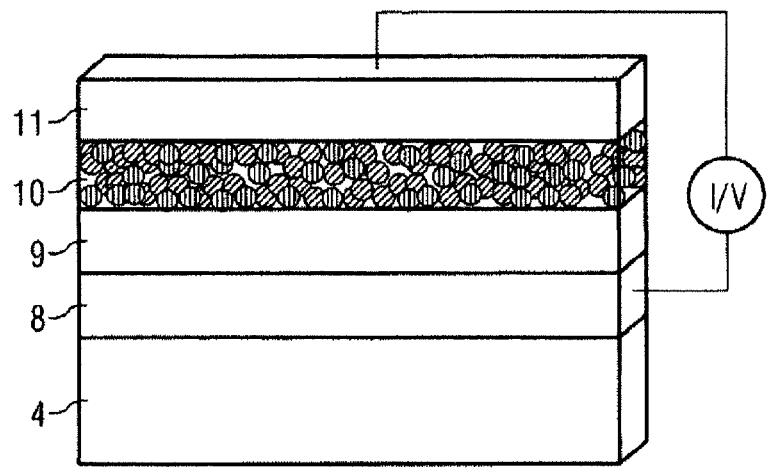
FIG. 3 shows a structure of an organic photodiode given by way of example.

Reference will now be made in detail to the preferred embodiments, examples of which are illustrated in the accompanying drawings, wherein like reference numerals refer to like elements throughout.

In FIG. 1, an apparatus is shown by way of example. At the top a sheet-like substrate 4 can be seen, perpendicular to which the spray head 2 is arranged. The spray heads 2 and 3, it also being conceivable for there to be further spray heads, are arranged as closely as possible to the perpendicular to the substrate. Although the system of the spray heads 1 to 3 can be fixed, spray heads may be movable both in relation to one another and in relation to the substrate, both during the spraying process and before or after. Behind the spray heads there are in the present case the respective tanks (or reservoir) 5 to 7. The tanks may be arranged as (and a holder may hold the each of the heads and reservoirs) desired and also connected to the spray heads by corresponding supply lines.

Here, multiple spray guns (any desired number) are used to produce a bulk heterojunction that contains multiple substances. These no longer have to be soluble in the same solvent. For each substance, a solution is prepared with a suitable solvent, with which the tanks of the different spray guns are filled. The spray nozzles are finally aligned such that the spray circles of the different guns lie one over the other on the substrate. Important geometrical parameters of the structure are in this case the distances of the nozzles from the substrate and the angle between the normal/perpendicular to the substrate and the ideal spray line. Other important parameters are the flow of solution through the gun nozzle and the concentration of solid matter of each solution. The polymer solutions are atomized by the nozzles into small drops, which impinge on the substrate and are deposited. Evaporation of the solvent causes a polymer layer to form.

Usually, the spray guns are firmly fixed, and the substrate is drawn past under the spray heads in a defined manner. Other configurations where the spray heads, or the spray heads and the substrate, move are conceivable.

FIG. 2a shows an embodiment in which two spray heads or spray guns are arranged one behind the other, so that two separate layers are sprayed on one directly behind the other. Thus, for example, a roll-to-roll spray coating can be realized. Here, the spray heads 12 and 13 are arranged one behind the other, so that, although they spray simultaneously, they spray different regions on the continuous strip substrate 14, that it is to say different surface areas of an endless substrate 14 drawn continuously over two rolls. Of course, three or more spray heads may equally well be arranged one behind the other. In this case, either the same spraying agents may be sprayed, or else different spraying agents.

All the semiconducting materials for organic electronic devices can be sprayed. Examples of materials that can be sprayed are: PEDOT:PSS, a hole conductor material. This material is used in various organic electronic devices, such as for example organic photodetectors, solar cells, organic photovoltaics, and/or in organic light-emitting diodes. In this case, the undiluted liquid material or an aqueous solution thereof can be sprayed, it being possible to vary in the ratio 1:0 (undiluted) to 1:1000 (one part PEDOT:PSS to 1000 parts water).

P3HT, MDMO-PPV and/or MEH-PPV:PCBM is a bulk heterojunction and is likewise used in the case of various organic electronic devices, such as for example organic photodetectors, solar cells, organic photovoltaics, and/or in organic light-emitting diodes. The weight ratio between the two materials may be used in a bandwidth of the ratio 1:0.5 to 1:5. The solids fraction in the solution is dependent on the solubility in the solvent and can vary in the range from 5% to 0.001% (weight ratio).

PCBM ([60]PCBM) is a fullerene derivative. It can take the form of the following derivatives and be sprayed:
[70]PCBM
[84]PCBM
[60]ThCBM
[60]PCB-A
[60]PCB-Cn.

In addition, there is also the possibility of mixing into the solution nanocrystals (quantum dots): CdSe, CdTe, PbSe or PbS. (Possible layer thicknesses from 50 nm to 1 mm). For example for NIR (near infrared) detectors or in the case of the direct conversion of x-rays.

FIG. 2b shows the principle of the multiple spray coating system with a single spray gun. A roll-to-roll production method is represented as an example. Here, the substrate, a strip substrate, is made to pass under the spraying spray head a number of times. This makes it possible to apply any desired layer thicknesses of functional polymers of the device with the same coating method. In the case of continuous roll-to-roll coating, a flexible strip substrate that can be rolled up is used. However, the embodiments can also be used equally well for rigid substrates, since the spraying apparatus may also be equipped with a mobile spray head, which moves over a rigid, fixed substrate. Finally, a rigid substrate may also be made to pass under a spray head a number of times. In any event, the embodiments covers all variants that lead to multiple spraying.

The principle of the roll-to-roll spray coating system is shown. Different spray guns 12 and 13 may be used, depending on the number of layers that the device has. It is thus possible to apply all the functional polymers of the device with the same coating method.

Until now, the PEDOT:PSS layer has been applied by spin coating or doctor blading methods. The reason for this is the desire to maintain the low surface roughness of the electrode in order to avoid possible short-circuits. However, spin coating and doctor blading entail the disadvantage that a roll-to-roll process is not possible. Spray coating or production by spraying the hole conductor layer, e.g. of PEDOT:PSS, with spray head 12 before the application of the active layer with spray head 13 offers the advantage that organic electronic devices can be produced completely with a single process technique. Moreover, with spray coating, the layer thickness can be optionally set. This is not possible in the case of spin coating or doctor blading on account of the technique or the limited solubility of organic semiconductors. For example, a hole conductor layer can be obtained with the apparatus in layer thicknesses of 50 nm to 1000 nm. Possible layer thicknesses of the bulk heterojunction P3HT:PCBM layer lie in the range from 50 nm to 1 mm.

Figure 6:
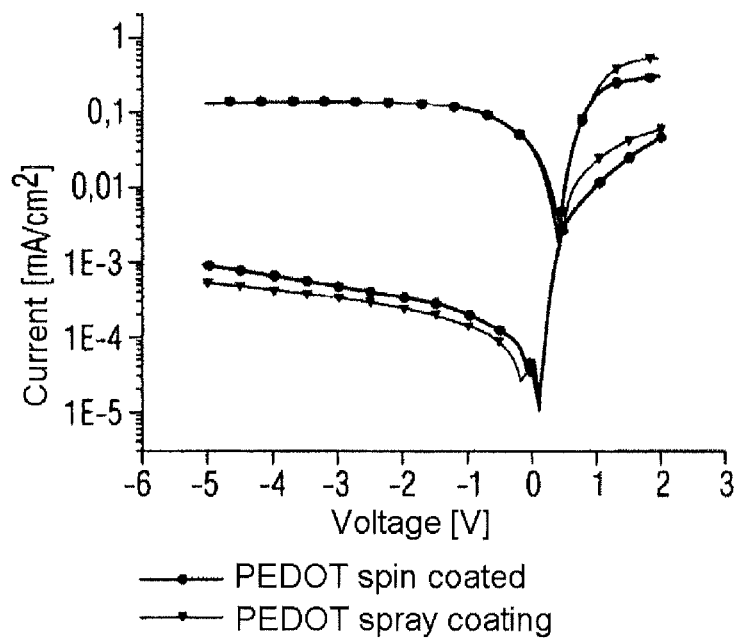
FIG. 6 shows the current/voltage curves for two organic photodiodes in comparison, the one photodiode (represented by the triangles) having a sprayed PEDOT:PSS layer and the other having been produced according to the prior art by spin coating.

Spray coating test structures were produced with a sprayed hole conductor, spray head 12 (PEDOT:PSS), and a semiconductor composite, spray head 13 (P3HT-PCBM blend), between an ITO bottom electrode and a Ca/Ag top electrode with functionally serviceable photodiodes. Current-voltage characteristics of two different photodiodes, one with a sprayed hole conductor layer and one with a spin-coated hole conductor layer, are represented in FIG. 6. As can be seen, the characteristics are virtually identical. This result is surprising to the extent that the high roughness of the spray-coated PEDOT:PSS can lead to short-circuits. Optical micrographs were taken of PEDOT:PSS layers applied by different coating methods. For each coating method, a 3D image created by a profilometer was also additionally presented. The comparison showed, as expected, that PEDOT:PSS layers applied by spin coating and doctor blading have a lower roughness (<10 nm on average) than those applied by spray coating (>50 nm).

The morphology of the blend layer is dependent on several parameters, such as for example the drop size of the sprayed solution. The drop size may influence the phase separation between the materials in the blend, and consequently also the extraction properties of the charge carriers. The morphology of the blend layer also has an influence on the mobility of the charge carriers and on the specific resistance of the layer.

With an apparatus according to the embodiments it is additionally possible to produce multilayer systems in a simple manner. For this purpose, one or more spray heads are merely switched off, while the others continue to spray. The multilayer system is produced by the different spray heads being moved repeatedly over the same location on the substrate. With the aid of this method it is possible to produce multilayer systems from pure substances or else multilayer systems from various blends or mixtures.

The method proposed here was tested in the production of organic photodiodes. However, all other spraying methods can be used equally well in the case of, for example, other organic electronic devices, such as solar cells, light-emitting diodes and field-effect transistors. It attempts to produce a bulk heterojunction with the aid of an atomizer with multiple spray heads.

FIG. 3 shows an organic photodiode that was produced for this test. It includes, on a substrate 4, a lower, preferably transparent, electrode 8, on that a hole conductor layer 9, preferably a PEDOT/PSS layer, and over that an organic photoconductive layer 10 in the form of a bulk heterojunction, with an upper electrode 11 over that. For example, the layers include a vertical layer system: ITO (bottom electrode)/PEDOT:PSS/P3HT-PCBM (spray coated blend)/Ca/Ag (top electrode). Selective electrodes are necessary in order to ensure a diode behavior of the device. The blend of the two components P3HT (polythiophene: absorber and hole transport component) and PCBM (fullerene derivative: electron acceptor and transport component) is the light-absorbing layer and acts as a "bulk heterojunction". One of two spray heads used for the production were operated with P3HT dissolved in chloroform, while a xylene solution with PCBM was contained in the other spray head.

The PEDOT/PSS layer is the optional hole transport layer 9. In addition to the layers shown here, protection of the device by an encapsulation is necessary.

Optical micrographs were taken of the P3HT/PCBM blend that was produced with the multiple spray coating system. The two nozzles were at the same distance from the substrate and had the same solution flow setting as well as the same pressure parameters at the spray heads. An inhomogeneous layer typical of sprayed layers could be clearly seen from the images. However, there was no evident separation between the two materials, which shows that the apparatus according to the embodiments can be used.

Figure 4:
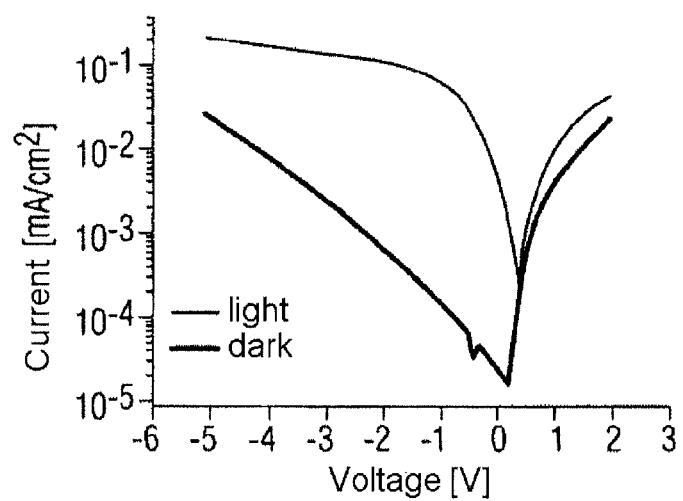
FIG. 4 shows a current/voltage curve of a device of which the organic active layer has been produced by an atomizer which sprays the same surface area simultaneously with multiple spray heads.
Figure 5:
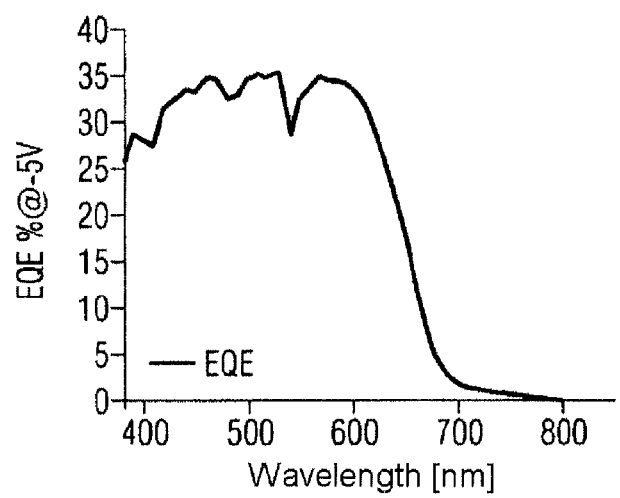
FIG. 5 shows the measurement of an external quantum efficiency of this device; the high quantum efficiency is evidence that a bulk heterojunction has been created.

FIG. 4 shows the measured I-V curves of the organic photodetector, the photo-active blend layer of which was produced from P3HT/PCBM by the method. The measured external quantum efficiency (EQE) in FIG. 5 shows that the bulk heterojunction produced has the desired functionality.

FIG. 6 shows the current-voltage characteristics (dark current and light current) for two organic photodiodes with a structure according to FIG. 3: substrate: glass, bottom electrode: ITO, intermediate layer: PEDOT:PSS, photo-active layer: "bulk heterojunction" of a blend of P3HT and PCBM, top electrode: Ca/Ag. The characteristics scarcely differ, although PEDOT:PSS was applied in one case by spin coating (●) and in the other by spray coating (▼). (Exposure intensity ~780 µW/cm2).

Figure 7:
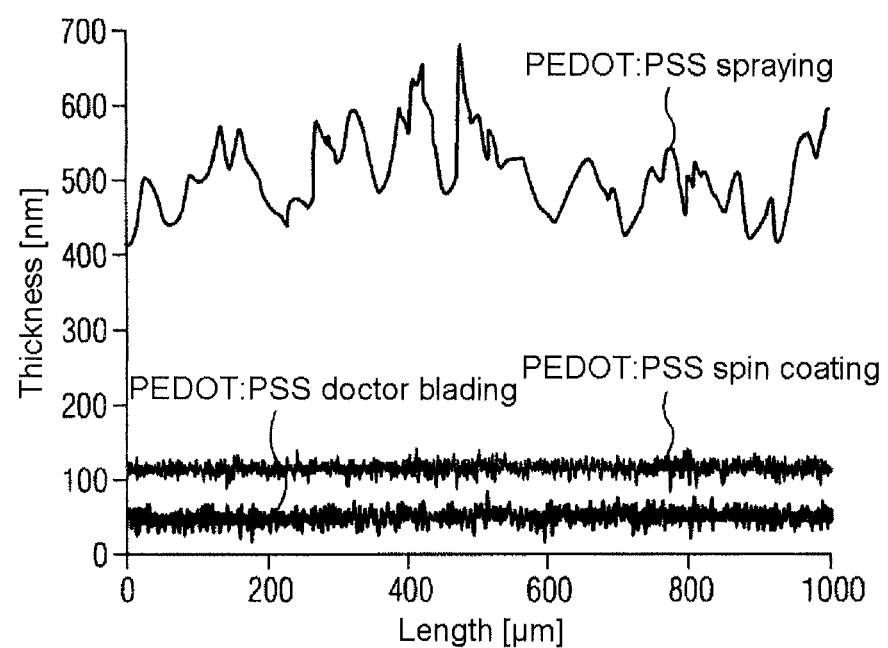
FIGS. 7 and 8 show layer thickness measurements with the aid of a profilometer.

FIG. 7 finally shows a layer thickness measurement with the aid of a profilometer for the various coating techniques. With spray coating, PEDOT:PSS layers of any desired thickness can be produced.

Figure 8:
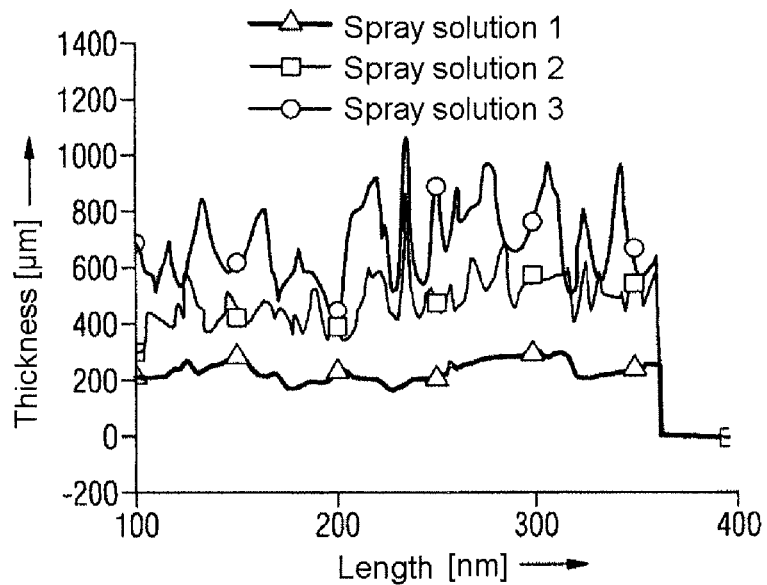

FIG. 8 shows a layer thickness measurement with the aid of a profilometer for three layers of PEDOT:PSS, sprayed by a multiple spray coating system with a single spray gun, as shown in FIG. 2b. The mean value of the layer thickness increases linearly as the number of spraying passes increases. It can be seen that layers 800 nm thick can be easily produced in the continuous roll-to-roll process. The graph with the triangles, the lowermost line, shows the layer thickness of a layer sprayed once. The line lying above it, with the squares, shows the layer thickness of a layer sprayed twice, and, finally, the uppermost line, with the circles, shows the layer sprayed three times, which is up to over 1000 nm thick. Accordingly, a layer sprayed on the basis of the embodiments can be produced without any problem with a layer thickness of 350 nm or more.

Figure 9:
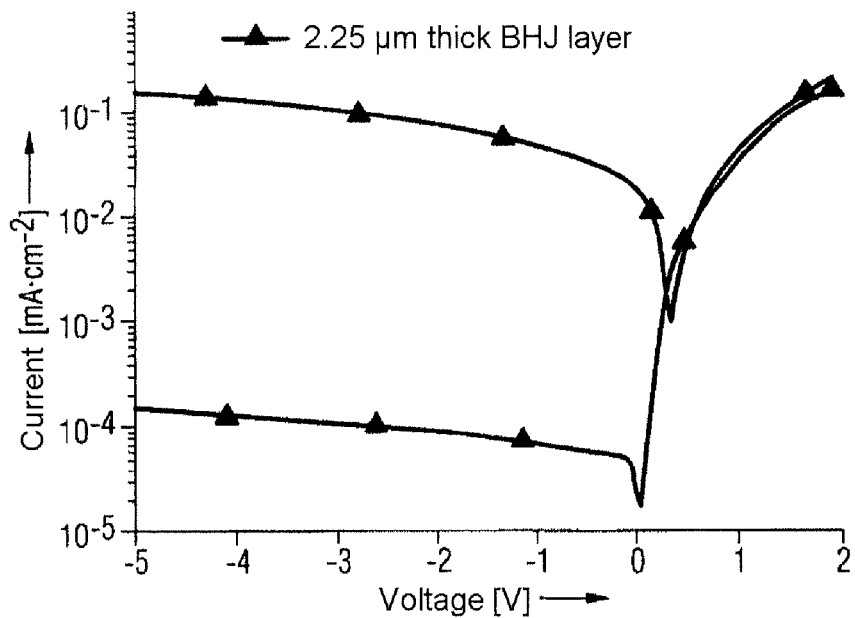
FIG. 9 shows a current-voltage characteristic (dark current and light current) for an organic photodiode.

FIG. 9 shows for example a current-voltage characteristic (dark current and light current) for an organic photodiode with a structure such as that shown for example in FIG. 3 (substrate: glass, lower, transparent bottom electrode: ITO, hole-conducting intermediate layer: PEDOT:PSS, photo-active layer: "bulk heterojunction" (BHJ) of a blend of P3HT and PCBM, top electrode: Ca/Ag). The two functional polymer layers were applied by the spray coating method. The PEDOT:PSS layer is ~200 nm thick, while the photo-active BHJ layer was produced by a triple, that is to say multiple, spray coating method with a single spray gun, as shown in FIG. 2b, and is ~2.25 µm thick.

With these embodiments, the production technique of organic devices is simplified for large-area applications and the production of functional polymer layer thicknesses that can be set as desired is made possible. Consequently, devices with a variable layer thickness of the hole conductor and the semiconductor can be produced by spraying methods.

Spray coating makes it possible to spray multiple layers one on top of the other without dissolving the previous lower layers. Thicker layers can then be produced by multiple spraying passes on one point and/or surface area.

The embodiments relate to an apparatus and a method for spraying layers of organic devices. In particular, the embodiments relate to spraying layers comprising multiple components, which for example are not soluble in the same solvent, and/or to spraying multiple layers one behind the other, in particular a hole conductor layer, for example of PEDOT/PSS, or multiple layers comprising one component to produce thick layers. Multiple spray heads are used, for example one behind the other and/or one next to the other.

The system also includes permanent or removable storage, such as magnetic and optical discs, RAM, ROM, etc. on which the process and data structures can be stored and distributed. The processes can also be distributed via, for example, downloading over a network such as the Internet. The system can output the results to a display device, printer, readily accessible memory or another computer on a network.

A description has been provided with particular reference to preferred embodiments thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV*, 358 F3d 870, 69 USPQ2d 1865 (Fed. Cir. 2004).

The invention claimed is:

1. An organic electronic device method, comprising providing a substrate, providing a lower electrode and providing an organic active layer with an upper electrode over it the organic active layer, the organic layer being a photoconductive layer obtainable in the form of a bulk heterojunction by spraying a sheet-like substrate with at least two different spraying agents being sprayed simultaneously onto a same surface area.

2. An organic electronic device method as claimed in claim 1, wherein the at least two different spraying agents are prepared from solutions comprising at least two different solvents.

3. An organic electronic device method as claimed in claim 1, wherein a first of the at least two spraying agents comprises at least one of P3HT, MDMO-PPV and MEH-PPV and a second of the at least two spraying agents comprises PCBM.

4. An organic electronic device method as claimed in claim 3, wherein PCBM has the form of at least one of [60]PCBM, [70]PCBM, [84]PCBM, [60]ThCBM, [60]PCB-A and [60] PCB-Cn.

5. An organic electronic device method as claimed in claim 1, wherein the photoconductive layer comprises P3HT and PCBM and has a layer thickness between 50 nm and 1 mm.

6. An organic electronic device method as claimed in claim 1, wherein the photoconductive layer is obtained from two spraying agents, the first spraying agent being a solution of P3HT in chloroform and the second spraying agent being a solution of PCBM in xylene.

\* \* \* \* \*